(12) United States Patent
Bosman et al.

(10) Patent No.: US 10,431,741 B2
(45) Date of Patent: Oct. 1, 2019

(54) METHOD OF MAKING AN ARRAY OF INTERCONNECTED SOLAR CELLS

(71) Applicant: Stichting Energieonderzoek Centrum Nederland, Petten (NL)

(72) Inventors: Johan Bosman, Petten (NL); Tristram Budel, Petten (NL)

(73) Assignee: Stichting Energieonderzoek Centrum Nederland, Petten (NL)

( * ) Notice: Subject to any disclaimer, the term of this patent is extended or adjusted under 35 U.S.C. 154(b) by 116 days.

(21) Appl. No.: 15/535,073

(22) PCT Filed: Dec. 17, 2015

(86) PCT No.: PCT/EP2015/080302
§ 371 (c)(1),
(2) Date: Jun. 12, 2017

(87) PCT Pub. No.: WO2016/102321
PCT Pub. Date: Jun. 30, 2016

(65) Prior Publication Data
US 2017/0373252 A1  Dec. 28, 2017

(30) Foreign Application Priority Data

Dec. 23, 2014 (NL) .................................. 2014043
Sep. 29, 2015 (NL) .................................. 2015520

(51) Int. Cl.
*H01L 51/00* (2006.01)
*H01L 51/42* (2006.01)
*H01L 27/30* (2006.01)

(52) U.S. Cl.
CPC ........ *H01L 51/0015* (2013.01); *H01L 27/301* (2013.01); *H01L 51/4233* (2013.01); *Y02E 10/549* (2013.01); *Y02P 70/521* (2015.11)

(58) Field of Classification Search
CPC ......... H01L 21/02255; H01L 21/02225; H01L 21/02252; H01L 21/3105; H01L 21/324;
(Continued)

(56) References Cited

U.S. PATENT DOCUMENTS

2008/0314439 A1* 12/2008 Misra ................... H01L 31/1876
136/249
2011/0045628 A1* 2/2011 Krebs ................... C08G 61/126
438/82
(Continued)

FOREIGN PATENT DOCUMENTS

EP  1953846 A1  8/2008
EP  2725587 A1  4/2014
(Continued)

OTHER PUBLICATIONS

Drury C J et al: "Low-cost all-polymer integrated circuits", Applied Physics Letters, American Institute of Physics, 2 Huntington Quadrangle, Melville, NY 11747, vol. 73, No. 1, Jul. 6, 1998 (Jul. 6, 1998), pp. 108-110, XP012020827, ISSN: 0003-6951, DOI: 10.1063/1.121783 the whole document.
(Continued)

*Primary Examiner* — Jeffrey T Barton
*Assistant Examiner* — Daniel P Malley, Jr.
(74) *Attorney, Agent, or Firm* — N.V. Nederlandsch Octrooibureau; Catherine A. Shultz; Tamara C. Stegmann

(57) ABSTRACT

Method of making an array of interconnected solar cells, including
a) providing a continuous layer stack (1) of a prescribed thickness on a substrate (8), the layer stack (1) including an upper (2) and a lower (3) conductive layer having a photoactive layer (4) and a semiconducting electron transport layer (6) interposed there between;
(Continued)

b) selectively removing the upper conductive layer (2) and the photoactive layer (4) for obtaining a contact hole (10) exposing the semiconducting electron transport layer (6);

c) selectively heating the layer stack (1) to a first depth (d1) for obtaining a first heat affected zone (12) at a first center-to-center distance (s1) from the contact hole (10), the first heat affected zone (12) being transformed into a substantially insulating region with substantially the first depth (d1) in the layer stack, thereby locally providing an increased electrical resistivity to the layer stack (1).

16 Claims, 3 Drawing Sheets

(58) Field of Classification Search
CPC ............... H01L 21/326; H01L 21/479; H01L 21/76227; H01L 21/76888; H01L 31/0465; H01L 31/046; H01L 31/0463; H01L 51/0015

See application file for complete search history.

(56) References Cited

U.S. PATENT DOCUMENTS

| | | | |
|---|---|---|---|
| 2012/0204930 A1* | 8/2012 | Verdugo | H01L 31/202 136/244 |
| 2013/0320323 A1 | 12/2013 | Segawa et al. | |
| 2016/0126376 A1* | 5/2016 | Jeong | H01L 31/022425 136/256 |
| 2016/0250712 A1* | 9/2016 | Cheng | B22F 1/0025 219/58 |

FOREIGN PATENT DOCUMENTS

| | | | |
|---|---|---|---|
| KR | 20130047513 A | 5/2013 | |
| WO | 2012/072271 A1 | 6/2012 | |
| WO | WO-2012072271 A1 * | 6/2012 | ............ B82Y 10/00 |
| WO | 2013/104514 A1 | 7/2013 | |

OTHER PUBLICATIONS

Chunfu Zhang et al: "Inverted Organic Photovoltaic Cells with Solution-Processed Zinc Oxide as Electron Collecting Layer", Jap. J. Appl. Phys., 2011, 50, 82302-1-82302-2, (XP001573498).

Sebastian Wilken et al: "Improvement of ITO-free inverted polymer-based solar cells by using colloidal zinc oxide nanocrystals as electron-selective buffer layer", Org. Electron., 2012, 13, 2386-2394, (XP055130168).

* cited by examiner

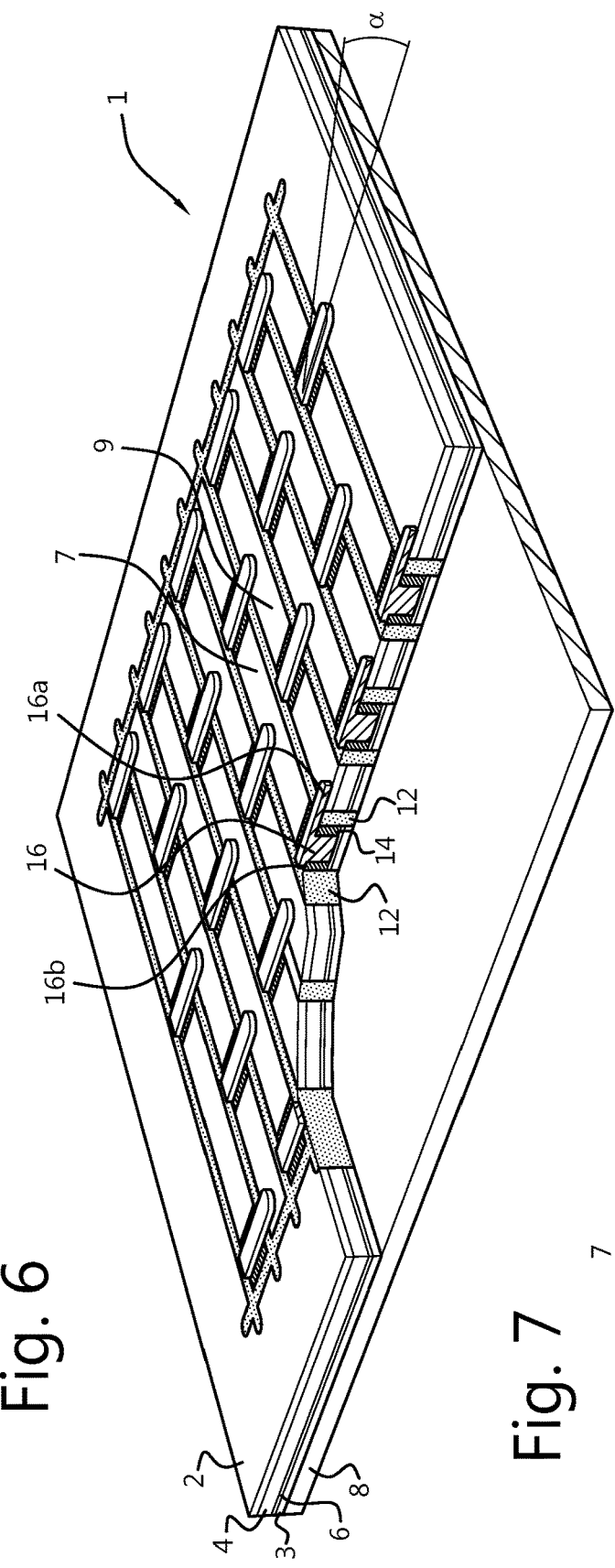
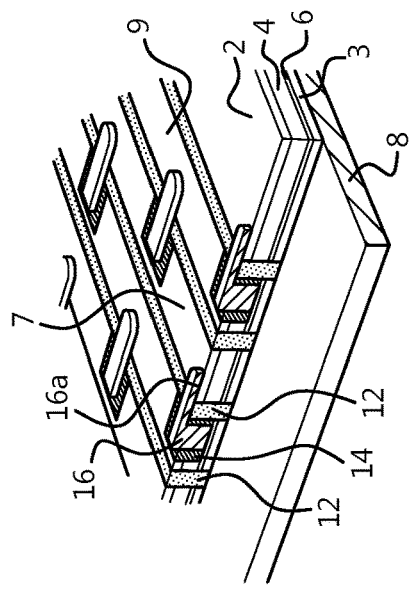

METHOD OF MAKING AN ARRAY OF INTERCONNECTED SOLAR CELLS

FIELD OF THE INVENTION

The present invention relates to a method of making an array of interconnected solar cells, in particular interconnections between thin film polymer or organic solar cells. In a further aspect, the present invention relates to a thin film polymer or organic solar cell array

PRIOR ART

US patent application US 2008/0314439 (MISRA) discloses a process of forming an array of monolithically integrated thin film photovoltaic cells from a stack of thin film layers formed on an insulating substrate includes the following steps. At least one cell isolation scribe is formed in the stack of thin film layers. Each instance of the at least one cell isolation scribe delineates the stack of thin film layers into a plurality of photovoltaic cells, and each instance of the at least one cell isolation scribe extends from a top surface of the stack of thin film layers to the substrate.

A second electrical contact layer isolation scribe is formed for each instance of the at least one cell isolation scribe. The second electrical contact layer isolation scribe is formed in the stack of thin film layers adjacent to a respective cell isolation scribe and extends at least through a second electrical contact layer of the stack of thin film layers.

A via scribe is formed in the stack of thin film layers between each cell isolation scribe and its respective second electrical contact layer isolation scribe. Each via scribe extends at least from the top surface of the stack of thin film layers to a first electrical contact layer of the stack of thin film layers.
Insulating ink is disposed in each cell isolation scribe, and conductive ink is disposed in each via scribe to form a via. Conductive ink is also disposed along the top surface of the stack of thin film layers to form at least one conductive grid, where each instance of the at least one conductive grid connects a respective via to the second electrical contact layer of an adjacent photovoltaic cell.

SUMMARY OF THE INVENTION

The present invention seeks to provide an improved method of making an array of interconnected solar cells, in particular polymer and/or organic solar cells, wherein the method imposes less restrictions on alignment requirements for various manufacturing steps and reduces cross-cellular as well as work area contamination. The method further optimizes the geometric fill factor and provides greater flexibility in defining the geometric layout of the interconnected solar cells as well as possible output voltages of the solar cell array.

The method of the present invention is suitable to be implemented as a roll-to-roll (R2R) process in ambient conditions utilizing benign solvents that are environmentally friendly, allowing for a significant increase in manufacturing output of large area, low cost, stable solar cell arrays and modules thereof. Production levels of up to 1 gigawatt on a yearly basis is feasible.

According to the present invention a method of the type defined in the preamble above is provided for solving at least in part the above objectives. The method comprises the steps of Method of making an array of interconnected solar cells, comprising the steps of
a) providing a continuous layer stack of a prescribed thickness on a substrate, the layer stack comprising an upper and lower conductive layer having a photoactive layer and a semi conductive electron transport layer interposed there between;
b) selectively removing the upper conductive layer and the photoactive layer for obtaining a contact hole exposing the semi conductive electron transport layer;
c) selectively heating the layer stack to a first depth for obtaining a first heat affected zone at a first centre-to-centre distance from the contact hole, the first heat affected zone being transformed into a substantially insulating region with substantially the first depth in the layer stack, thereby locally providing an increased electrical resistivity to the layer stack.

According to the present invention and advantages thereof, the method allows for a continuous layer stack to be conveniently partitioned into a plurality of solar cells wherein individual solar cells are both geometrically defined as well as electrically decoupled through a straightforward selective heating step. In particular, the overall geometric fill factor, cell padding and cell spacing of the solar cell array, as well as the layout of individual solar cells, are defined by the pattern used to selectively heat the continuous layer stack.

In view of the prior art, the method of the invention minimizes removing material from the layer stack for obtaining a plurality of areas representing individual solar cells. Actively depositing an electrically insulating barrier at positions from which layer stack material has been removed is circumvented as well. As a result the method of the present invention reduces depositing alignment requirements and various work area and layer stack contamination issues. The method further provides large area, low cost and stable scalability of a continuous roll-to-toll (R2R) production process in ambient conditions, which is particularly desirable for large area production of thin film polymer and/or organic solar cell arrays and modules thereof.

In an embodiment, the method may further comprise the step of d) selectively heating the layer stack to a second depth less than the prescribed thickness for obtaining a second heat affected zone at a second centre-to-centre distance from the contact hole, the second heat affected zone being transformed into a substantially insulating region with the second depth of the layer stack, thereby locally providing an increased electrical resistivity up to the second depth in the layer stack. Typically, the second depth may be equal to a combined thickness of the upper conductive layer and the photoactive layer. This embodiment provides partial electrical insulation between two solar cells, wherein the lower conductive layer may remain intact and pass underneath the second heat affected zone to facilitate a serial connection between two solar cells.

In an embodiment, the step of d) selectively heating may comprise continuously heating the layer stack to the second depth during a second prescribed period for preventing layer stack ablation.

To obtain a full electrically insulating perimeter or barrier, in an embodiment the first depth may be equal to the prescribed thickness, so that the layer stack is transformed to an electrically insulating barrier over the (entire) prescribed thickness for delineating individual solar cells.

In an embodiment the method step of c) selectively heating may comprise continuously heating the layer stack to the first depth during a first prescribed period, so that layer stack stack material and layer structure thereof, is locally transformed and rendered electrically inactive, such as an electrically insulating barrier. The steps of c), d) selectively heating to the first and/or the second depth may comprise continuous wave non-ablative laser scribing. Continuous wave non-ablative laser scribing typically enables tight control over the transformation process to prevent ablation of layer stack material.

In a further embodiment, the step of b) selectively removing the upper conductive layer and the photoactive layer comprises pulsed heating said layers during a prescribed pulsation period, wherein pulsed heating may be accomplished by pulsed layer ablation in advantageous embodiments. Pulsed heating allows for tight control of higher laser ablation intensities.

In another embodiment, the method of the present invention may further comprise, after the steps of a), b) and c), the step of e) depositing an electrical interconnecting member at least in part continuously covering the contact hole, the first heat affected zone and the upper conductive layer distal to the contact hole. This method step allows for an electrical connection between two solar cells, such as an serial electrical connection there between.

In advantageous embodiments depositing the electrical interconnecting member may comprise conductive printing the electrical interconnecting member using a printing compound comprising silver, carbon, copper, aluminium and/or carbon nanotubes. These materials can be printed by inkjet or screen printing techniques.

According to the present invention, the method is suitable for large scale, stable roll-to-roll (R2R) production of solar cells. In an advantageous embodiment, mass production of solar cells, in particular interconnected solar cell arrays, may be further increased and facilitated by simultaneously performing the steps of selectively removing b) and selectively heating c), d) to the first and second depth.

In a further aspect the present invention relates to a thin film organic solar cell array. The thin film organic solar cell array comprises a layer stack having a prescribed thickness disposed on a flexible substrate, the layer stack comprising upper and lower polymer conductive layers having an organic photoactive layer and a semi conductive electron transport layer interposed there between;

at least one contact hole in the layer stack completely extending through the upper conductive layer and the organic photoactive layer, the contact hole having a depth less than the prescribed thickness;

at least one first heat affected zone at a first centre-to-centre distance from the at least one contact hole and having a depth equal to the prescribed thickness of the layer stack, and at least one second heat affected zone at a second centre-to-centre distance from the at least one contact hole and having a depth of a combined thickness of the upper conductive layer and the photoactive layer, wherein the first and second heat affected zone each provide an increased electrical resistivity to the layer stack, and at least one electrical connecting member at least in part continuously covering the at least one contact hole, the at least one first heat affected zone and the upper conductive layer distal to the at least one contact hole.

In an embodiment, a width of the second heat affected zone is larger than a width of the contact hole and the contact hole is arranged within or borders on the second heat affected zone, the second centre-to-centre distance being near or substantially zero. This embodiment provides a compact arrangement of the contact hole and second heat affected zone.

SHORT DESCRIPTION OF DRAWINGS

The present invention will be discussed in more detail hereinafter based on a number of exemplary embodiments with reference to the drawings, in which FIG. 1 shows an embodiment of a continuous layer stack according to the present invention;

FIG. 6 shows an embodiment of an array of interconnected solar cells according to the present invention; and FIG. 7 depicts an alternative embodiment of an array of interconnected solar cells according to the present invention.

DETAILED DESCRIPTION OF EXEMPLARY EMBODIMENTS

Figure 1:
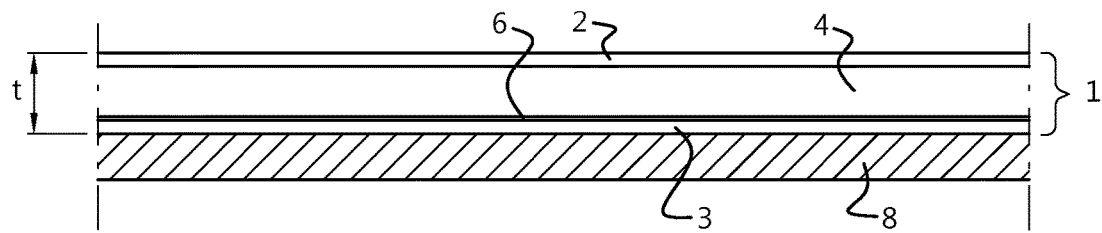

FIG. 1 shows an embodiment of a continuous layer stack 1 according the present invention. From the continuous layer stack 1 an array of interconnected solar cells is to be manufactured, ideally through a scalable continuous roll-to-roll process that allows for fast, large area and low cost mass production of up to e.g. 1 gigawatt or more on an annual basis.

The continuous layer stack 1 has a prescribed thickness t and comprises relatively smooth upper 2 and lower 3 conductive layers having a photoactive layer 4 and a semi conductive electron transport layer 6 interposed there between. In typical embodiments the layer stack 1 is disposed on top of a substrate 8, which may or may not be a pliable substrate 8. The upper 2 and lower 3 conductive layers of the layer stack 1 may be envisaged as front and back electrodes respectively.

In an embodiment the upper 2 and lower 3 conductive layers each comprise a polymer material, such as PEDOT. In further embodiments the photoactive layer 4 may comprise organic material, and the semi conductive electron transport layer 6 may comprise Zinc Oxide (ZnO). To allow for a low cost, large scale roll-to-roll production process of solar cells, the substrate 8 may comprise a flexible or pliable foil, which may be transparent in particular embodiments for e.g. two-sided illumination of a solar cell. In an exemplary embodiment the substrate 8 may comprise a thin PET foil or film.

In order to make an array of interconnected solar cells of the type defined in the preamble, the method of the present invention comprises the step of a) providing the continuous layer stack 1 of a prescribed thickness t on a substrate 8, wherein the layer stack 1 comprises upper 2 and lower 3 conductive layers having interposed there between a photoactive layer 4 and a semi conductive electron transport layer 6. In typical embodiments the upper 2 and lower 3 layer may each comprise a polymer material, e.g. PEDOT, and where the photoactive layer 4 may comprise e.g. an organic material and the semi conductive electron transport layer may comprise e.g. Zinc Oxide (ZnO).

The substrate 8 may initially be supplied on a roll as a thin, pliable and possibly transparent foil. The substrate 8 may then be subjected through a high speed manufacturing process for depositing the continuous layer stack 1 onto the substrate 8. The manufacturing process may take place in atmospheric conditions and does not require a vacuum. The final product at the end of the first step is a continuous layer stack 1 of which a cross section is depicted in FIG. 1. At this stage the continuous layer stack 1 does not yet comprise interconnected solar cells as such but may be envisaged as an endless rectangular, relatively smooth thin layer stack 1 disposed on a pliable foil 8.

Figure 2:
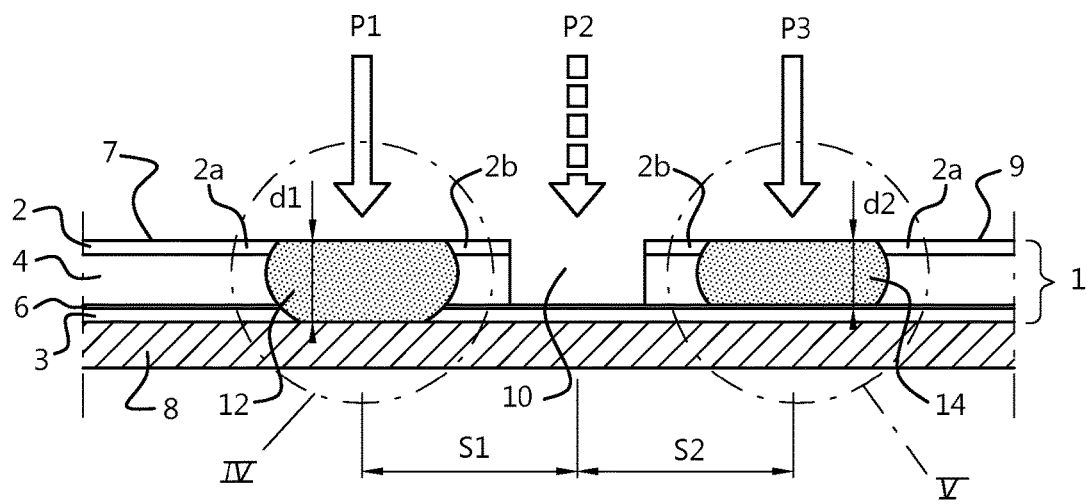
FIG. 2 shows an embodiment of a contact hole and a heat affected area according to the present invention.

According to the invention, providing an array of tightly spaced solar cells in the continuous layer stack 1 having a high geometric fill factor can be succinctly explained by means of FIG. 2

FIG. 2 shows an embodiment of a layer stack 1 provided with electrically insulating regions 12, 14 and a contact hole 10 exposing the semi conductive electron transport layer 6. In the embodiment shown the continuous layer stack 1 of FIG. 1 has been subjected to a further step of the method comprising the step of b) selectively removing the upper conductive layer 2 and the photoactive layer 4 for obtaining a contact hole 10 exposing the semi conductive electron transport layer 6. In an embodiment, the electron transport layer 6 may also be selectively removed for exposing the lower conductive layer 3. That is, the contact hole 10 of the present invention may have a depth up to the electron transport lower 6 or it may have a depth up to the lower conductive layer 3. In many embodiments the contact hole 10 typically has a depth less the prescribed thickness t. In some embodiments the contact hole 10 may comprise a substantially round, elliptic, square, rectangular, or polygon shaped hole in the layer stack 1.

In an embodiment, the depicted dotted arrow "P2" denotes the method step of b) wherein selectively removing the upper conductive layer 2 and the photo-active layer 4 may comprise pulsed heating said layers 2, 4 during a prescribed pulsation period. The prescribed pulsation period is chosen to obtain the desired depth for a given heat intensity of a single pulse. In a specific embodiment, selectively removing b) comprises pulsed laser ablation, which allows for a precisely controlled intermitted thermal heating utilizing high intensity laser pulses, which may cause local sublimation of layer stack material to occur.

The method further comprises the step of c) selectively heating the layer stack 1 to a first depth d1 for obtaining a first heat affected zone 12 at a first centre-to-centre distance s1 from the contact hole 10, so that the first heat affected zone 12 is transformed into a substantially insulating region with substantially the first depth d1, thereby locally providing an increased electrical resistivity to the layer stack 1. The term "transformed" in light of the invention may be construed as a local transformation of one material composition to another material composition. That is, the transformation may be envisaged as a process wherein the layer stack 1 is locally damaged to the extent that electrical conductivity properties are significantly reduced. The transformation in the step of c) selectively heating the layer stack 1 thus refers to a process wherein the first heat affected zone 12 becomes an electrical insulator.

According to the present invention, and in contrast to prior art methods, instead of removing material from the layer stack 1 to define and isolate areas that are to represent individual solar cells in the layer stack 1, the step of c) selectively heating the layer stack 1 to the first depth d1 effectively transforms and renders the first heat affected zone 12 electrically inactive, i.e. the first heat affected zone 12 electrically decouples one area of the layer stack 1 from another area of the layer stack 1 along the first heat affected zone 12. In most embodiments the first heat affected zone 12 may be envisaged as an electrically insulating perimeter or barrier extending through the layer stack 1. The insulating perimeter or barrier formed by the first heat affected zone 12 may enclose a rectangular, square, triangular, or even a general polygon area within the layer stack 1 that is to represent an individual solar cell. The step of c) selectively heating may be arranged such that the first heat affected zone 12 comprises a minimal width to obtain sufficient electrical resistivity between one area of the layer stack 1 to another area of the layer stack 1 separated by the first heat affected zone 12.

In a typical embodiment the first depth d1 equals the prescribed thickness t of the layer stack 1, so that an electrically insulating perimeter is created through the entire thickness of the layer stack 1 that provides sufficient electrical resistivity to along the first heat affected zone 12.

Selectively or locally heating the layer stack 1 according to the invention has many advantages over prior art methods that rely on actual removal of layer stack material to create an electrically insulating perimeter, wherein the removal of layer stack material is typically accomplished through an etching or ablation process. One of the advantages of the present invention is that work area contamination caused by a prior art removal process is circumvented. Selectively or locally heating according to the invention does not remove material in any way but locally transforms a material composition of the layer stack 1 to another material composition having substantially less electrical conductivity. As mentioned earlier, selectively heating the layer stack 1 essentially "destroys" the layered structure and electrical conductivity thereof. For example, the step of c) selectively heating may be envisaged as a process that locally fuses or mingles the various layers of the layer stack 1 together, thereby significantly reducing the electrical conductivity thereof and thus increasing electrical resistivity of the layer stack 1 throughout the first heat affected zone 12.

In many embodiments the step of c) selectively heating as described above may comprise continuously heating the layer stack 1 to the first depth d1 during a first prescribed period. Continuous heating of the layer stack 1 allows for moderate heating intensities so that the layer stack 1 at the first heat affected zone 12 is able to transform the layer stack 1 in a controlled fashion to prevent ablation, yet to achieve required electrically insulating properties between solar cells. In advantageous embodiments the step of c) selectively heating the layer stack 1 to the first depth d1 may comprise continuous wave laser heating.

The depicted full arrow "P1" in FIG. 2 denotes the step of c) selectively heating of the layer stack 1 at the first heat affected zone 12 in a continuous fashion.

According to the invention, a continuous layer stack 1 may thus be provided with a plurality of closely spaced solar cells through a simple selective or local heating process, wherein an electrically insulating perimeter or barrier is created between solar cells. By using a laser apparatus, for example, the first heat affected zone 12 can be made very thin for maximizing the geometric fill factor of layer stack 1, wherein the geometric fill factor may be viewed as the number of solar cells per unit area of a layer stack 1. Furthermore, a laser apparatus can be readily used in a mechanized and automated process to provide a large area layer stack 1 with a plurality of tightly spaced solar cells. For example, in a practical embodiment a thin film continuous layer stack 1 may be provided on a thin pliable substrate 8 and moved along a laser apparatus arranged for scribing the first heat affected zone 12 into the layer stack 1. Typically, the laser apparatus may be arranged for scribing rectangular or square insulating perimeters or barriers within in the layer stack 1 to electrically decouple areas of the layer stack 1 that are to represent solar cells.

In a further embodiment, the method of the present invention may further comprise the step of d) selectively heating the layer stack 1 to a second depth d2 less than the prescribed thickness t for obtaining a second heat affected zone 14 at a second centre-to-centre distance s2 from the contact hole 10. The second heat affected zone 14 is transformed into a substantially electrically insulating region with the second depth d2 in the layer stack 1, thereby locally providing an increased electrical resistivity (e.g. electrical insulation) up to the second depth d2 in the layer stack 1.

In a typical embodiment, the second depth d2 equals a combined thickness of the upper conductive layer 2 and the photoactive layer 4. In this embodiment the upper conductive layer 2 and photoactive layer 4 undergo local transformation such that the electrical resistivity of the upper conductive layer 2 and photoactive layer 4 is significantly increased up to the second depth d2. Note that the semi conductive electron transport layer 6 and lower conductive layer 3 remain by and large intact and retain their electrical conductivity. As depicted in FIG. 2, this embodiment allows for an electrical pathway underneath the second heat affected zone 14.

In an alternative embodiment, the second depth d2 may equal a combined thickness of the upper conductive layer 2, the photoactive layer 4 and the semi conductive electron transport layer 6. In this embodiment only the lower conductive layer 3 retains its electrical conductivity and is not transformed by the second heat affected zone 14 disposed above it.

As with the selectively heating step indicated by the arrow "P1" in FIG. 2, in an embodiment the step of d) selectively heating the layer stack 1 to a second depth d2 may comprise continuously heating the layer stack 1 to the second depth d2 during a second prescribed period. The continuous heating of the layer stack 1 allows for moderate heating intensities during the second prescribed period to prevent ablation, yet to allow the layer stack 1 to locally transform into an electrically insulation perimeter without removing layer stack material.

According to an embodiment, the method step of c) selectively heating the layer stack 1 to the first depth d1 and d) selectively heating the layer stack 1 to a second depth d2 may each comprise non-ablative laser scribing, or more specifically continuous wave non-ablative laser scribing. These embodiments provide an electrically insulating perimeter or barrier within the layer stack 1 up to the first and/or second depth d1, d2 by locally transforming the layer stack 1. Continuous wave non-ablative laser scribing may also be used to tightly control the transformation process and prevent ablation. Since laser scribing is readily automated and mechanized, large area, low cost and stable production of solar cells is now within reach, offering a feasibly roll-to-roll manufacturing process. In alternative embodiments, the steps of c), d) selectively heating to the first and/or the second depth d1, d2 may comprise pulsed wave non-ablative laser scribing, so wherein laser pulse intensities remain below an ablation threshold.

On a general note, for all embodiments and applications wherein a pulsed or continuous laser is used for selectively removing or selectively heating the layer stack 1, laser wave intensities and laser wave lengths can of course be chosen to meet various requirements.

In the embodiment depicted in FIG. 2, once the method steps of c), d) selectively heating are completed, the first and second heat affected zone 12, 14 are disposed at a first and second centre-to-centre distance s1, s2 respectively from the contact hole 10. Between each electrically insulating perimeter or barrier 12 14, i.e. the first and second heat affected zones 12, 14, the upper conductive layer 2 comprises a proximal upper part 2b adjoining the heat affected zones 12,14 proximal to the contact hole 10. The upper conductive layer 2 further comprises a distal upper part 2a adjoining the first and second heat affected zone 12, 14 distal to the contact hole 10. The proximal and distal upper parts 2a, 2b may embody transition zones where the transformation process during the steps of c), d) selectively heating is partially performed. That is, the proximal and distal upper parts 2a, 2b of the upper conductive layer 2 may still be electrically conductive to large degree and need not exhibit a level of electrical resistivity comparable the first and second heat affected zone 12, 14.

As a final result of the method steps of c), d) selectively heating, the upper conductive layer 2 comprises electrically decoupled layer stack areas 7, 9 each representing a solar cell according to the invention, wherein the first heat effected zone 12 provides a full electrical insulating perimeter interposed between a first and second solar cell 7, 9.

Figure 3:
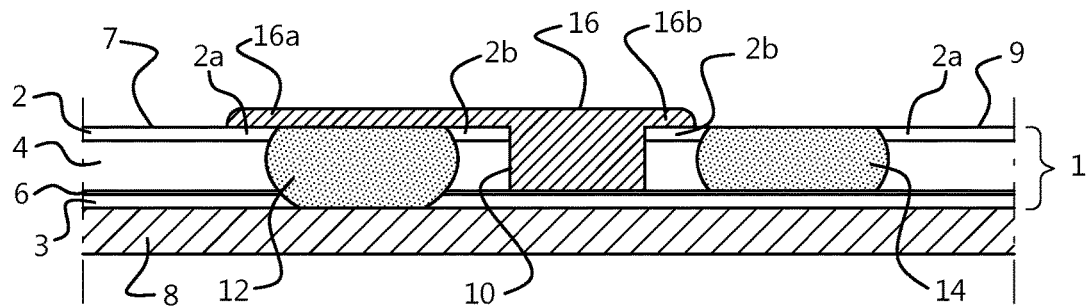
FIG. 3 shows an embodiment of an electrical interconnecting member according to the present invention.

FIG. 3 shows an embodiment of interconnected solar cells via an electrical interconnecting member according to the present invention. In the embodiment shown, once the first and second heat affected zones 12, 14 are provided, an electrical interconnecting member can be provided between the first and second solar cell 7, 9 for allowing a series connection there between. To that end an embodiment of the method is provided wherein the method may further comprise, after the method steps of a), b) and c), the step e) of depositing an electrical interconnecting member 16 at least in part continuously covering the contact hole 10, the first heat affected zone 12 and the upper conductive layer 2 distal to the contact hole 10. The electrical interconnecting member 16 comprises a first overlap region 16a for connecting to a non-transformed part of the upper conductive layer 2 of the first solar cell 7, wherein the first overlap region 16a extends well beyond the first heat affected zone 12, i.e. well beyond the distal upper part 2a, for ensuring that the electrical conductivity of the non-transformed upper conductive layer 2 is fully utilized. Optionally, the electrical interconnecting member 16 may further comprise a second overlap region 16b covering the proximal upper part 2b of the second solar cell 9. The second heat affected zone 14 is then adapter to ensure that the second overlap region 16b of the electrical interconnecting member 16 does not come into contact with upper conductive layer 2 of the second solar cell 9, which could result in a short circuit between the semi conductive electron transport layer 6 and/or lower conductive layer 3 and the upper conductive layer 2 of the second solar cell 9.

In an embodiment, the method step of e) depositing the electrical interconnecting member 16 comprises conductive printing the electrical interconnecting member 16 using a printing compound comprising silver, carbon, copper, aluminium, and/or carbon nanotubes. In a further embodiment, a printing compound for printing the electrical interconnecting member 16 comprises PEDOT and/or other transparent electrically conductive materials. Advantageously, printing an electrical connecting member 16 can be performed quickly and with sufficient accuracy, making it suitable for large area, low cost and stable production of an array of interconnected solar cells in e.g. a roll-to-roll (R2R) process. In typical embodiments printing may be performed through inkjet printing.

According to the presenting invention, the method disclosed above merely uses ablative processing for providing a contact hole 10 and utilizes non-ablative heating for electrically decoupling individual solar cells, particularly through a non-ablative selective heating process. This minimizes work area and layer stack 1 contamination during manufacturing as removal of layer stack 1 material is avoided for providing electrical insulation perimeters, i.e. the first heat affected zones 12. Advantageously, the geometric fill factor of a layer stack 1 may be maximised by using a laser scribing process to selectively heat and provide extremely thin electrical barriers between individual solar cells 16. For example, in advantageous embodiments the method steps of c), d) selectively heating to the first and second depth d1,d2 may lead the first and second heat affected zone 12,14 each having a width less than 100 nm.

In view of mass production of interconnected solar cells, such as megawatts or even gigawatts on a daily basis, the method of the present invention allows for performing methods steps in parallel or simultaneously. To that end in an advantageous embodiment the steps of b) selectively removing and selectively heating c), d) to the first and second depth d1, d2 may be performed simultaneously.

Simultaneously performing the selective removal b) and selective heating steps c), d) may be implemented by a mechanical component comprising e.g. three heat sources, a first heat source being responsible for the method step of b) selective removal of layer stack 1 material to obtain a contact hole 10, and a second and third heat source being responsible for the method steps of c), d) selectively heating to the first and second depth d1, d2 respectively to obtain the first and second heat affected zones 12, 14. Mechanized and automated pulsed and continuous laser scribing heads are typical examples of heat sources that may be applied simultaneously, or non-simultaneously of course.

Figure 4:
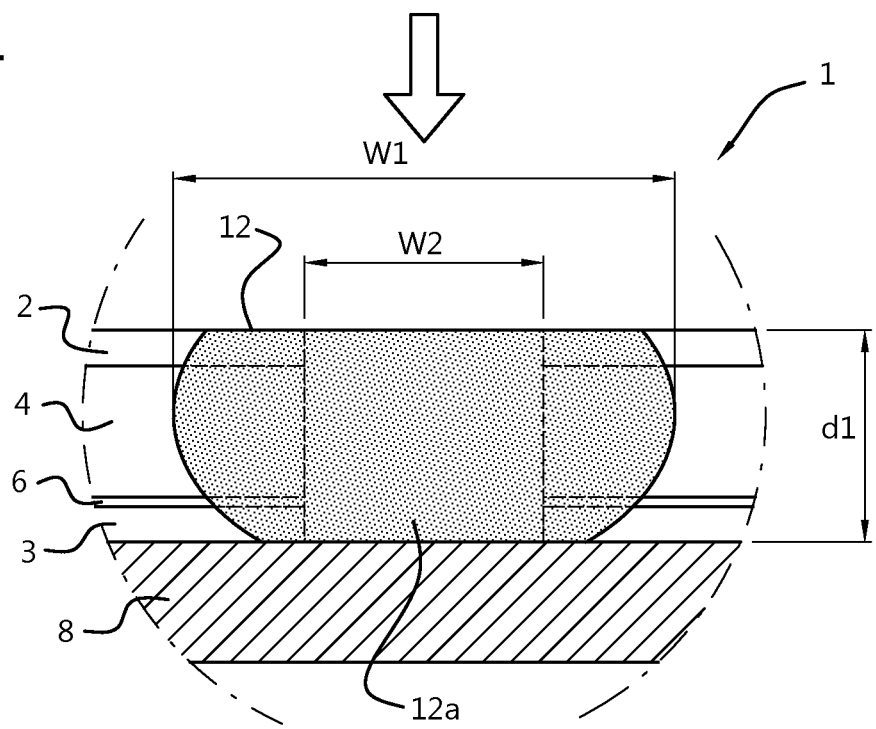
FIG. 4 shows an embodiment a heat affected zone according to the present invention.
Figure 5:
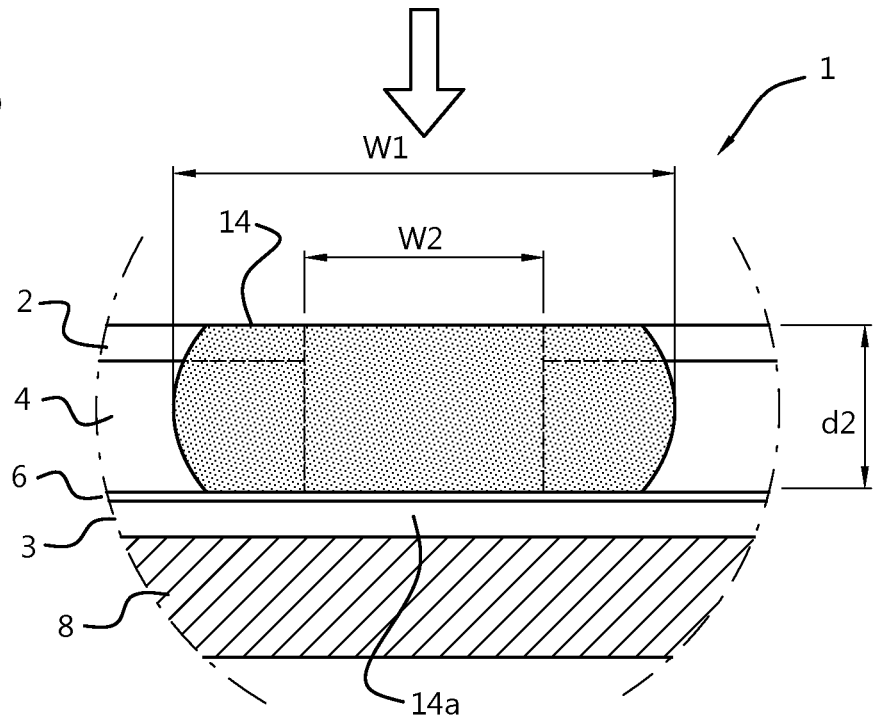
FIG. 5 shows another embodiment of a heat affected zone according to the present invention.

FIG. 4 and FIG. 5 each show an embodiment of a first and second heat affected zone 12, 14 according to the present invention. In FIG. 4 the first heat affected zone 12 extends to the first depth d1, wherein the first depth d1 equals the prescribed thickness t of the layer stack 1, thereby providing a full electrically insulating perimeter for delimiting a solar cell. According to the invention, the first heat affected zone 12 may be assigned a zone width w1 in which layer stack material 1 is subjected to and affected by the method step of c) selective heating to the first depth d1. In practical implementations, when using a laser heat source for example, the first heat affected zone 12 may typically comprise a spot zone 12*a* in which all layers of the payer stack 1 are fused or mingled together and wherein layer stack material is transformed such that the first heat affected zone 12 exhibits a significantly increased electrical resistive. The difference between the zone width w1 and spot width w2 comprises a transition zone in which a partial transformation of the layer stack 1 is present exhibiting intermediate electrical conductivity compared to a non-transformed layers stack 1 and the spot zone 12*a*.

In the embodiment of FIG. 5 the second heat affected zone 14 extends to the second depth d2 less than the prescribed thickness t. In some embodiments the second depth d2 equals a combined thickness of the upper conductive layer 2 and the photoactive layer 4 as shown in FIG. 5. In an alternative embodiment the second depth d2 equals a combined thickness of the upper conductive layer 2, the photo active layer 4 and the semiconductor electron transport layer 6. The second heat affected zone 14 may also be assigned a zone width w1 and a spot region 14*a* having a spot width w2, wherein the spot width w2 comprises a fully transformed, fused or mingled layer stack 1 exhibiting a significantly increased electrical resistivity extending to the second depth d2. As in FIG. 4, the difference between the zone width w1 and spot width w2 comprises a transition zone in which a partial transformation of the layer stack 1 is present exhibiting intermediate electrical conductivity compared to a layers stack 1 that has not been subjected to selective or local heating.

In view of the present invention it is readily understood that a particular heat source used for the methods steps of c), d) selectively heating to the first and second depth d1, d2, will have an influence on the zone width w1, spot width w2 and the difference there between.

Returning to the embodiment shown in FIG. 2, the contact hole 10 and second heat affected zone 14 are disposed at a sufficiently large centre-to-centre distance s2 such that the contact hole 10 does not infringe on the second heat affected zone 14.

According to the invention it may be advantageous to have a more compact layout of the contact hole 10 and second heat affected zone 14. For example, in an embodiment a width of the second heat affected zone 14 is larger than a width of the contact hole 10, wherein the contact hole 10 is arranged within the second heat affected zone 13. In such a compact embodiment the second centre-to-centre distance s2 is near or substantially zero, wherein the contact hole 10 may have an overall width smaller that the zone width w1 or the spot width w2 of the second heat affected zone.

FIGS. 6 and 7 each show an embodiment of an array of interconnected solar cells manufactured according to the method of the present invention.

In the embodiment of FIG. 6 a three dimensional view of an array of interconnected solar cells is depicted as well as a cross sectional view thereof. As can be seen, according to the method step of c) selectively heating to the first depth d1 a first and second solar cell 7, 9 of the array are electrically decoupled through the first heat affected zone 12 defining an electrically insulating perimeter, wherein the first and second solar cell 7, 9 have a rectangular shape. According to the method step of d) selectively heating to a second depth d2, the second heat affected zone 14 extends between two first heat affected zones 12 substantially perpendicular thereto. The second heat effected zone 14 is seen to have a second depth d2 that equals a combined thickness of the upper conductive layer 2 and photoactive layer 4. In this particular embodiment, the contact hole 10 is disposed within the second heat affected zone 14, but in an alternative embodiment the contact hole 10 may also be interposed between two parallel second heat affected zones 14 extending between two first heat affected zones 12.

From FIG. 6 it is readily observed that the first overlap region 16*a* of the electrical interconnecting member 16 interconnects an upper conductive layer 2 of the second solar cell 9 and a semi conductive electron transport layer 6 of the first solar cell 7, wherein the second heat affected zone 14 prevents electrical conductivity between the electrical interconnecting member 16 and an upper conductive layer 2 of the first solar cell 7. This particular configuration thus allows for a series connection of a plurality of solar cells, where in this embodiment the solar cells are formed as elongated rectangular strips electrically decoupled by means the first heat affected zone 14. The second overlap region 16*b* of the electrical interconnecting member 16 may come into contact with the first heat affected zone 14, but is not allowed to come into contact with an upper conductive layer 2.

Because the depicted array of interconnected solar cells is to be provided in a continuous layers stack 1 in a fast, large area roll-to-roll (R2R) process, the method of the present invention must allow for possible misalignment of the electrical interconnecting member 16, such as during high speed printing which may inevitably impose limited accuracy.

For example, in an exemplary scenario the electrical interconnecting member 16 may be deposited in a more skewed way as indicated by the skew angle α. Since any electrical conductivity must be avoided between the electrical interconnecting member 16 and an upper conductive layer 2 of a solar cell with the associated contact hole 10, the second heat affected zone 14 may be provided as a sufficiently large electrically insulating perimeter around the electrical interconnecting member 16 to avoid short circuiting the solar cell in question.

FIG. 7 depicts an alternative embodiment of an array of interconnected solar cells according to the present invention. In this particular embodiment the second heat affected zone 14 is connected to only one first heat affected zone 12, instead of two first heat affected zones 14 as depicted in FIG. 6. In the embodiment shown, the contact hole 10 may be provided after the second heat affected zone 14 has been created, for example. The method step of b) selectively removing the upper conductive layer 2 and the photoactive layer 4 for obtaining a contact hole 10 may then actually involve removing an upper part of the second heat affected zone 14, wherein the upper conductive layer 2 and photoactive layer 4 have been transformed, fused or mingled. In another embodiment, the second heat affected zone 14 may also be provided as a U-shaped electrically insulating perimeter around the electrical connecting member 16. In the embodiments of FIG. 7 the upper conductive layers 2 of the first and second solar cells 7, 9 are larger when all other dimensions equal those of the embodiment shown in FIG. 6. As a result, the embodiment of FIG. 7 may exhibit a higher light conversion efficiency.

In a further aspect, the present invention relates to a thin film polymer or organic solar cell array. The thin film polymer or organic solar cell of the present invention is suitable to be manufactured by means of the method of the present invention. Reference is made to all FIGS. 1 to 7. The thin film organic solar cell array of the present invention comprises a layer stack 1 having a prescribed thickness t disposed on a flexible substrate 8, the layer stack comprising upper and lower polymer conductive layers 2, 3 having an organic photoactive layer 4 and a semi conductive electron transport layer 6 interposed there between. The array further comprises at least one contact hole 10 in the layer stack 1 completely extending through the upper conductive layer 2 and the organic photoactive layer 4, wherein the contact hole 10 has a depth less than the prescribed thickness t. At least one first heat affected zone 12 is provided at a first centre-to-centre distance s1 from the at least one contact hole 10 having a depth equal to the prescribed thickness t of the layer stack 1. The array further comprises at least one second heat affected zones 14 at a second centre-to-centre distance s2 from the at least one contact hole 10 and having a depth of a combined thickness of the upper conductive layer 2 and the photoactive layer 4, wherein the first and second heat affected zone 12,14 each provide an increased electrical resistivity to the layer stack 1. The array further comprises at least one electrical connecting member 16 at least in part continuously covering the at least one contact hole 10, the at least one first heat affected zone 12 and the upper conductive layer 2 distal to the at least one contact hole 10.

In an advantageous embodiment, a width of the second heat affected zone 14 is larger than a width of the contact hole 10, wherein the contact hole 10 is arranged within the second heat affected zone 14. This embodiment may be referred to the "P2 in P3" variant and is depicted in FIGS. 6 and 7 for example.

The present invention can now be summarized by the following embodiments:

Embodiment 1

Method of making an array of interconnected solar cells, comprising the steps of
a) providing a continuous layer stack (1) of a prescribed thickness (t) on a substrate (8), the layer stack (1) comprising an upper (2) and a lower (3) conductive layer having a photoactive layer (4) and a semi conductive electron transport layer (6) interposed there between;
b) selectively removing the upper conductive layer (2) and the photoactive layer (4) for obtaining a contact hole (10) exposing the semi conductive electron transport layer (6);
c) selectively heating the layer stack (1) to a first depth (d1) for obtaining a first heat affected zone (12) at a first centre-to-centre distance (s1) from the contact hole (10), the first heat affected zone (12) being transformed into a substantially insulating region with substantially the first depth (d1) in the layer stack, thereby locally providing an increased electrical resistivity to the layer stack (1).

Embodiment 2

Method according to embodiment 1, further comprising:
d) selectively heating the layer stack (1) to a second depth (d2) less than the prescribed thickness (t) for obtaining a second heat affected zone (14) at a second centre-to-centre distance (s2) from the contact hole (10),
the second heat affected zone (14) being transformed into a substantially insulating region with the second depth (d2) of the layer stack (1), thereby locally providing an increased electrical resistivity up to the second depth (d2) in the layer stack 1.

Embodiment 3

Method according to embodiment 2, wherein the second depth (d2) equals a combined thickness of the upper conductive layer (2) and the photoactive layer (4).

Embodiment 4

Method according to any one of embodiments 1-3, wherein the step of (c) selectively heating comprises continuously heating the layer stack (1) to the first depth (d1) during a first prescribed period.

Embodiment 5

Method according to any one of embodiments 1-4, wherein the first depth (d1) equals the prescribed thickness (t).

Embodiment 6

Method according to embodiment 2 or 3, wherein the step of (d) selectively heating comprises continuously heating the layer stack (1) to the second depth (d2) during a second prescribed period.

Embodiment 7

Method according to embodiment 2, 3 or 6, wherein the steps of (c, d) selectively heating to the first and/or the second depth (d1, d2) comprises continuous wave non-ablative laser scribing.

Embodiment 8

Method according to any one of embodiments 1-7, wherein the step of (b) selectively removing the upper conductive layer (2) and the photoactive layer (4) comprises pulsed heating said layers during a prescribed pulsation period.

Embodiment 9

Method according to any one of embodiments 1-8, wherein the step of (b) selectively removing comprises pulsed laser ablation.

Embodiment 10

Method according to any one of embodiments 1-9, further comprising, after the steps of a), b) and c), the step e) of depositing an electrical interconnecting member (16) at least in part continuously covering the contact hole (10), the first heat affected zone (12) and the upper conductive layer (2) distal to the contact hole (10).

Embodiment 11

Method according to embodiment 10, wherein depositing the electrical interconnecting member (e) comprises conductive printing the electrical interconnecting member using a printing compound comprising silver, carbon, copper, aluminium and/or carbon nanotubes.

Embodiment 12

Method according to any one of embodiments 2, 3, 6 or 7 wherein the steps of selectively removing (b) and selectively heating (c, d) to the first and second depth (d1, d2) are performed simultaneously.

Embodiment 13

Method according to any one of embodiments 2, 3, 6, 7 or 12 wherein a width of the second heat affected zone (12) is larger than a width of the contact hole (10), the contact hole (10) being arranged within the second heat affected zone (14).

Embodiment 14

Method according to any one of embodiments 1-13, wherein each of the two conductive layers (2,3) is a polymer layer, the photoactive layer (4) comprising organic material.

Embodiment 15

Method according to any one of embodiments 1-14, wherein the substrate (8) is a flexible substrate comprising a plastic foil.

Embodiment 16

Method according to any one of embodiments 1-15, wherein the first and second heat affected zone (12, 14) each have a width less than 100 nm.

Embodiment 17

Thin film organic solar cell array comprising a layer stack (1) having a prescribed thickness (t) disposed on a flexible substrate (8), the layer stack (1) comprising upper (2) and lower (3) polymer conductive layers having an organic photoactive layer (4) and a semi conductive electron transport layer (6) interposed there between;

at least one contact hole (10) in the layer stack (1) completely extending through the upper conductive layer (2) and the organic photoactive layer (4), the contact hole (10) having a depth less than the prescribed thickness (t);

at least one first heat affected zone (12) at a first centre-to-centre distance (s1) from the at least one contact hole (10) and having a depth equal to the prescribed thickness (t) of the layer stack (1), and at least one second heat affected zone (14) at a second centre-to-centre distance (s2) from the at least one contact hole (10) and having a depth of a combined thickness of the upper conductive layer (2) and the photoactive layer (4), wherein the first and second heat affected zone (12, 14) each provide an increased electrical resistivity to the layer stack (1), and at least one electrical connecting member (16) at least in part continuously covering the at least one contact hole (10), the at least one first heat affected zone (12) and the upper conductive layer (2) distal to the at least one contact hole (10).

Embodiment 18

Thin film organic solar cell array according to embodiment 17, wherein a width of the second heat affected zone (14) is larger than a width of the contact hole (10) and the contact hole (10) is arranged within or borders on the second heat affected zone (14).

The present invention embodiments have been described above with reference to a number of exemplary embodiments as shown in and described with reference to the drawings. Modifications and alternative implementations of some parts or elements are possible, and are included in the scope of protection as defined in the appended claims.

The invention claimed is:

1. Method of making an array of interconnected solar cells, comprising the steps of
   a) providing a continuous layer stack of a prescribed thickness (t) on a substrate, the layer stack comprising an upper and a lower conductive layer having a photoactive layer and a semi conductive electron transport layer interposed there between;
   b) selectively removing the upper conductive layer and the photoactive layer for obtaining a contact hole exposing the semi conductive electron transport layer;
   c) selectively heating the layer stack to a first depth (d1) for obtaining a first heat affected zone at a first centreto-centre distance (s1) from the contact hole, the first heat affected zone being transformed into a substantially insulating region with substantially the first depth (d1) in the layer stack, thereby locally providing an increased electrical resistivity to the layer stack.

2. Method according to claim 1, further comprising:

d) selectively heating the layer stack to a second depth (d2) less than the prescribed thickness (t) for obtaining a second heat affected zone at a second centre-to-centre distance (s2) from the contact hole, the second heat affected zone being transformed into a substantially insulating region with the second depth (d2) of the layer stack, thereby locally providing an increased electrical resistivity up to the second depth (d2) in the layer stack.

3. Method according to claim 2, wherein the second depth (d2) equals a combined thickness of the upper conductive layer and the photoactive layer.

4. Method according to claim 1, wherein the step of (c) selectively heating comprises continuously heating the layer stack to the first depth (d1) during a first prescribed period.

5. Method according to claim 1, wherein the first depth (d1) equals the prescribed thickness (t).

6. Method according to claim 2, wherein the step of (d) selectively heating comprises continuously heating the layer stack to the second depth (d2) during a second prescribed period.

7. Method according to claim 2, wherein the steps of (c, d) selectively heating to the first and/or the second depth (d1, d2) comprises continuous wave non-ablative laser scribing.

8. Method according to claim 1, wherein the step of (b) selectively removing the upper conductive layer and the photoactive layer comprises pulsed heating said layers during a prescribed pulsation period.

9. Method according to claim 1, wherein the step of (b) selectively removing comprises pulsed laser ablation.

10. Method according to claim 1, further comprising, after the steps of a), b) and c), the step e) of depositing an electrical interconnecting member at least in part continuously covering the contact hole, the first heat affected zone and the upper conductive layer distal to the contact hole.

11. Method according to claim 10, wherein depositing the electrical interconnecting member (e) comprises conductive printing the electrical interconnecting member using a printing compound comprising silver, carbon, copper, aluminum, carbon nanotubes, or combinations thereof.

12. Method according to claim 2, wherein the steps of selectively removing (b) and selectively heating (c, d) to the first and second depth (d1, d2) are performed simultaneously.

13. Method according to claim 2, wherein a width of the second heat affected zone is larger than a width of the contact hole, the contact hole being arranged within the second heat affected zone.

14. Method according to claim 1, wherein each of the two conductive layers is a polymer layer, and the photoactive layer comprises organic material.

15. Method according to claim 1, wherein the substrate is a flexible substrate comprising a plastic foil.

16. Method according to claim 1, wherein the first and second heat affected zone each have a width less than 100 nm.

* * * * *

UNITED STATES PATENT AND TRADEMARK OFFICE
CERTIFICATE OF CORRECTION

PATENT NO. : 10,431,741 B2
APPLICATION NO. : 15/535073
DATED : October 1, 2019
INVENTOR(S) : Johan Bosman and Tristram Budel Page 1 of 1

It is certified that error appears in the above-identified patent and that said Letters Patent is hereby corrected as shown below:

On the Title Page

Item (73), Assignee should be listed as NEDERLANDSE ORGANISATIE VOOR TOEGEPAST-NATUURWETENSCHAPPELIJK ONDERZOEK TNO, THE HAGUE, NETHERLANDS.

Signed and Sealed this
Seventh Day of April, 2020

Andrei Iancu
*Director of the United States Patent and Trademark Office*